(12) United States Patent
Yoo et al.

(10) Patent No.: US 11,037,910 B2
(45) Date of Patent: Jun. 15, 2021

(54) SEMICONDUCTOR DEVICE HAVING LATERALLY OFFSET STACKED SEMICONDUCTOR DIES

(71) Applicant: Micron Technology, Inc., Boise, ID (US)

(72) Inventors: Chan H. Yoo, Boise, ID (US); Ashok Pachamuthu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/933,649

(22) Filed: Jul. 20, 2020

(65) Prior Publication Data

US 2020/0350293 A1 Nov. 5, 2020

Related U.S. Application Data

(62) Division of application No. 15/686,029, filed on Aug. 27, 2017, now abandoned.

(51) Int. Cl.
*H01L 25/065* (2006.01)
*H01L 25/00* (2006.01)

(52) U.S. Cl.
CPC .......... *H01L 25/0657* (2013.01); *H01L 25/50* (2013.01); *H01L 2224/0401* (2013.01);
(Continued)

(58) Field of Classification Search
CPC ................. H01L 25/0657; H01L 25/50; H01L 2225/0651; H01L 2225/06517;
(Continued)

(56) References Cited

U.S. PATENT DOCUMENTS 9,040,408 B1 5/2015 Zhou et al.
9,324,687 B1 4/2016 Kelkar et al.
(Continued)

FOREIGN PATENT DOCUMENTS

KR 20030059459 A 7/2003
KR 20090088271 A 8/2009
(Continued)

OTHER PUBLICATIONS

International Application No. PCT/US2018/042429—International Search Report and Written Opinion, dated Nov. 30, 2018, 13 pages.
(Continued)

*Primary Examiner* — Timor Karimy
(74) *Attorney, Agent, or Firm* — Perkins Coie LLP

(57) ABSTRACT

Semiconductor devices including stacked semiconductor dies and associated systems and methods are disclosed herein. In one embodiment, a semiconductor device includes a first semiconductor die coupled to a package substrate and a second semiconductor die stacked over the first semiconductor die and laterally offset from the first semiconductor die. The second semiconductor die can accordingly include an overhang portion that extends beyond a side of the first semiconductor die and faces the package substrate. In some embodiments, the second semiconductor die includes bond pads at the overhang portion that are electrically coupled to the package substrate via conductive features disposed therebetween. In certain embodiments, the first semiconductor die can include second bond pads electrically coupled to the package substrate via wire bonds.

19 Claims, 10 Drawing Sheets

(52) U.S. Cl.
CPC ............... *H01L 2224/04042* (2013.01); *H01L 2224/32145* (2013.01); *H01L 2224/32225* (2013.01); *H01L 2224/49112* (2013.01); *H01L 2224/73203* (2013.01); *H01L 2224/73215* (2013.01); *H01L 2224/73253* (2013.01); *H01L 2224/73265* (2013.01); *H01L 2224/81005* (2013.01); *H01L 2224/81192* (2013.01); *H01L 2224/83005* (2013.01); *H01L 2224/85005* (2013.01); *H01L 2224/97* (2013.01); *H01L 2225/0651* (2013.01); *H01L 2225/06517* (2013.01); *H01L 2225/06562* (2013.01); *H01L 2225/06565* (2013.01); *H01L 2225/06582* (2013.01); *H01L 2924/15311* (2013.01); *H01L 2924/18161* (2013.01)

(58) Field of Classification Search
CPC . H01L 2225/06562; H01L 2225/06565; H01L 2225/06582; H01L 2224/0401; H01L 2224/04042; H01L 2224/32145; H01L 2224/32225; H01L 2224/49112; H01L 2224/73203; H01L 2224/73215; H01L 2224/73253; H01L 2224/73265; H01L 2224/81005; H01L 2224/81192; H01L 2224/83005; H01L 2224/97; H01L 2924/15311; H01L 2924/18161
See application file for complete search history.

(56) References Cited

U.S. PATENT DOCUMENTS

| | | |
|---|---|---|
| 9,859,245 B1 | 1/2018 | Chen et al. |
| 9,984,992 B2 | 5/2018 | Delacruz et al. |
| 10,103,038 B1 | 10/2018 | Yoo et al. |
| 2004/0262774 A1 | 12/2004 | Kang et al. |
| 2005/0029644 A1 | 2/2005 | Ho et al. |
| 2005/0147801 A1 | 7/2005 | Taggert et al. |
| 2005/0242422 A1 | 11/2005 | Klein et al. |
| 2006/0220262 A1 | 10/2006 | Meyer et al. |
| 2008/0150157 A1 | 6/2008 | Nishimura et al. |
| 2009/0008762 A1 | 1/2009 | Jung et al. |
| 2009/0239339 A1 | 9/2009 | Yeh et al. |
| 2011/0068427 A1 | 3/2011 | Paek et al. |
| 2011/0186977 A1 | 8/2011 | Chi et al. |
| 2011/0194265 A1 | 8/2011 | Su et al. |
| 2012/0256280 A1 | 10/2012 | Erhart et al. |
| 2013/0105966 A1 | 5/2013 | Kelkar et al. |
| 2013/0241055 A1 | 9/2013 | Kim et al. |
| 2013/0320518 A1 | 12/2013 | Chun |
| 2014/0027906 A1 | 1/2014 | Narita et al. |
| 2014/0264817 A1 | 9/2014 | Lee et al. |
| 2015/0028474 A1 | 1/2015 | Jang et al. |
| 2015/0270232 A1 | 9/2015 | Chen et al. |
| 2016/0133601 A1 | 5/2016 | Ko et al. |
| 2016/0148918 A1 | 5/2016 | Ye et al. |
| 2017/0025380 A1 | 1/2017 | Zhai et al. |
| 2017/0033062 A1 | 2/2017 | Liu et al. |
| 2017/0069532 A1 | 3/2017 | Lee et al. |
| 2017/0141257 A1 | 5/2017 | Tsai et al. |
| 2018/0053745 A1 | 2/2018 | Cheng et al. |
| 2018/0069163 A1 | 3/2018 | Clark et al. |
| 2018/0138150 A1 | 5/2018 | Eom et al. |
| 2018/0315737 A1 | 11/2018 | Meyer et al. |
| 2019/0067034 A1 | 2/2019 | Pachamuthu et al. |
| 2019/0067038 A1 | 2/2019 | Yoo et al. |
| 2019/0067248 A1 | 2/2019 | Yoo et al. |
| 2019/0326249 A1 | 10/2019 | Meyers et al. |
| 2019/0371766 A1 | 12/2019 | Liu et al. |
| 2020/0084880 A1 | 3/2020 | Ooi et al. |

FOREIGN PATENT DOCUMENTS

| | | |
|---|---|---|
| KR | 20110020547 A | 3/2011 |
| KR | 1020120005340 A | 1/2012 |
| KR | 20130077939 A | 7/2013 |
| KR | 2015000782 A | 9/2013 |
| TW | 200828559 A | 7/2008 |
| TW | 201620106 A | 6/2016 |
| TW | 201725687 A | 7/2017 |

OTHER PUBLICATIONS

International Application No. PCT/US2018/042435—International Search Report and Written Opinion, dated Nov. 30, 2018, 14 pages.
International Application No. PCT/US2018/042442—International Search Report and Written Opinion, dated Oct. 31, 2018, 18 pages.
Pachamuthu, A. et al., Unpublished United States Patent Application entitled "Hybrid Additive Structure Stackable Memory Die Using Wire Bond", filed Aug. 24, 2017, 31 pages.
TW Patent Application No. 107126265—Taiwanese Office Action and Search Report, dated Nov. 1, 2019, with English Translation, 20 pages.
TW Patent Application No. 107126265—Taiwanese Office Action and Search Report, dated May 16, 2019, with English Translation, 21 pages.
TW Patent Application No. 107126637—Taiwanese Office Action and Search Report, dated Apr. 8, 2019, with English Translation, 12 pages.
TW Patent Application No. 107126681—Taiwanese Office Action and Search Report, dated Jul. 8, 2019, with English Translation, 13 pages.

US 11,037,910 B2

SEMICONDUCTOR DEVICE HAVING LATERALLY OFFSET STACKED SEMICONDUCTOR DIES

CROSS-REFERENCE TO RELATED APPLICATION

This application is a division of U.S. patent application Ser. No. 15/686,029, filed Aug. 24, 2017, and titled "SEMICONDUCTOR DEVICE HAVING LATERALLY OFFSET STACKED SEMICONDUCTOR DIES," which is incorporated herein by reference in its entirety.

TECHNICAL FIELD

The present disclosure generally relates to semiconductor devices. In particular, the present technology relates to semiconductor devices having a semiconductor die stack that includes laterally offset semiconductor dies, and associated systems and methods.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies and yet increase the capacity and/or speed of the resulting encapsulated assemblies. To meet these demands, semiconductor die manufacturers often stack multiple semiconductor dies vertically on top of each other to increase the capacity or performance of a microelectronic device within the limited volume on the circuit board or other element to which the semiconductor dies are mounted.

In some semiconductor die stacks, stacked dies are directly electrically interconnected—e.g., using through-silicon vias (TSVs) or flip-chip bonding—for providing an electrical connection to the circuit board or other element to which the dies are mounted. However, interconnecting the dies in this manner requires additional processing steps to create the vias and/or metallization features necessary to interconnect the dies. In other semiconductor die stacks, the stacked dies are wire bonded to the circuit board or other element. While using wire bonds can avoid the cost and complexity associated with interconnecting the dies, wire bonds increase the total height of the die stack because they loop above each die in the stack, including the uppermost die.

DETAILED DESCRIPTION

Specific details of several embodiments of semiconductor devices are described below. In several of the embodiments described below, a semiconductor device includes a first semiconductor die coupled to a package substrate and a second semiconductor die stacked over the first semiconductor die and laterally offset from the first semiconductor die. Accordingly, the second semiconductor die can include an overhang portion that extends beyond at least one side of the first semiconductor die. In some embodiments, the second semiconductor die is stacked over only a first portion of the first semiconductor die and not a second portion of the first semiconductor die. In certain embodiments, (a) bond pads of the first semiconductor die are located at the first portion and electrically coupled to the package substrate via wire bonds, and (b) bond pads of the second semiconductor die are located at the overhang portion and electrically coupled to the package substrate via conductive pillars. Because bond pads of both the first and second semiconductor dies are directly electrically coupled to the package substrate, the formation of electrical interconnections between the stacked dies is not necessary. Moreover, the height of the semiconductor device is not limited by the height of the wire bonds, since the wire bonds are only coupled to the first semiconductor die and need not extend beyond the upper surface of the second semiconductor die.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As used herein, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1A:
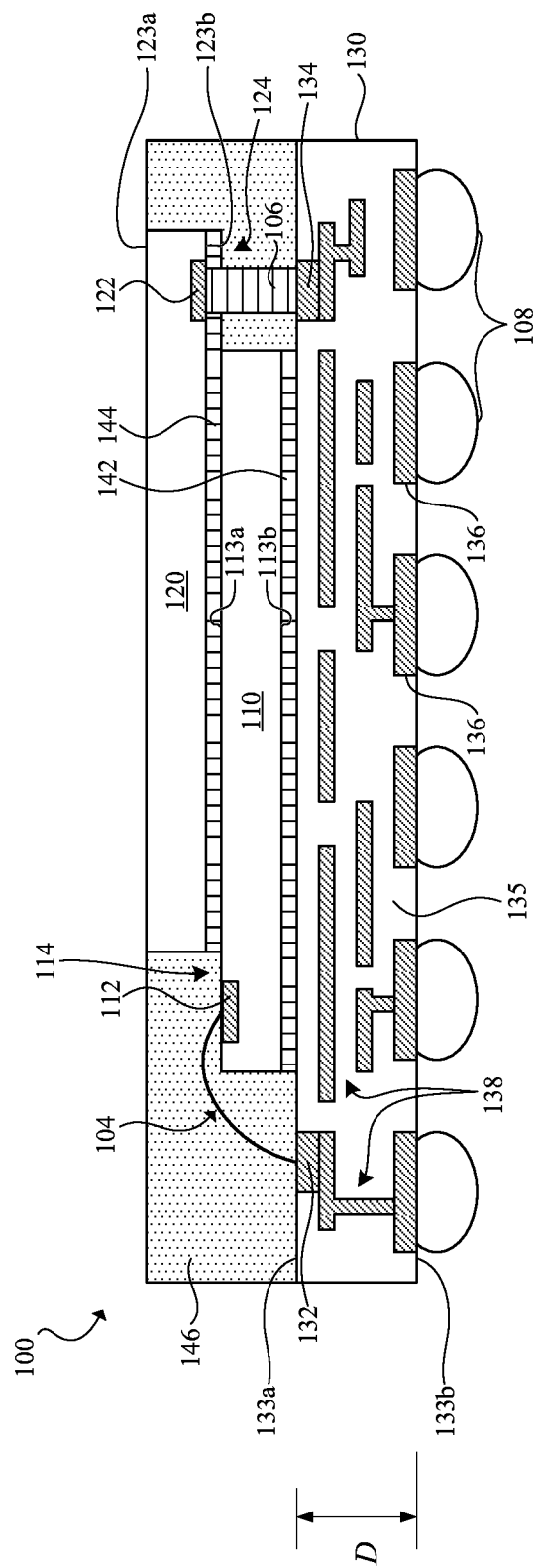
FIGS. 1A and 1B are a cross-sectional view and a top plan view, respectively, illustrating a semiconductor device in accordance with embodiments of the present technology.
Figure 1B:
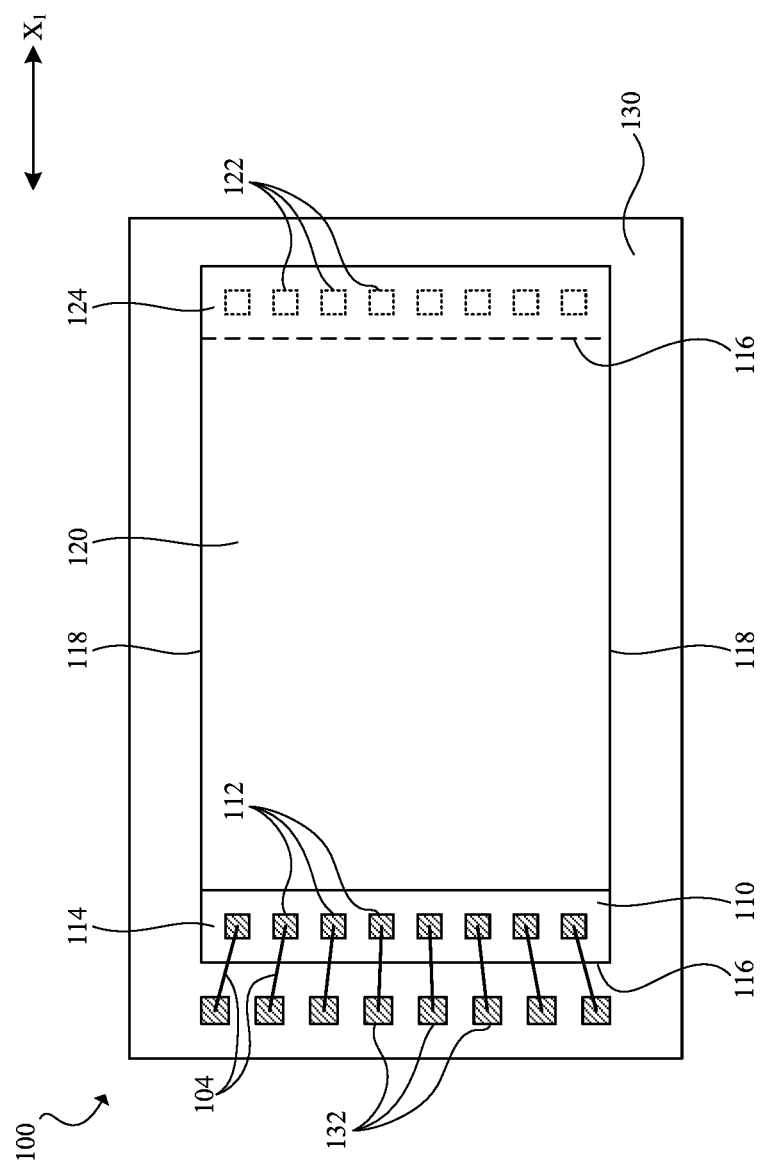

FIG. 1A is a cross-sectional view, and FIG. 1B is a top plan view, illustrating a semiconductor device 100 ("device 100") in accordance with an embodiment of the present technology. With reference to FIG. 1A, the device 100 includes a first semiconductor die 110 and a second semiconductor die 120 (collectively "semiconductor dies 110, 120") carried by a package substrate 130. The semiconductor dies 110, 120 can each have integrated circuits or components, data storage elements, processing components, and/or other features manufactured on semiconductor substrates. For example, the semiconductor dies 110, 120 can include integrated memory circuitry and/or logic circuitry, which can include various types of semiconductor components and functional features, such as dynamic random-access memory (DRAM), static random-access memory (SRAM), flash memory, other forms of integrated circuit memory, processing circuits, imaging components, and/or other semiconductor features. In some embodiments, the semiconductor dies 110, 120 can be identical (e.g., memory dies manufactured to have the same design and specifications), but in other embodiments the semiconductor dies 110, 120 can be different from each other (e.g., different types of memory dies or a combination of controller, logic, and/or memory dies).

Figure 4:
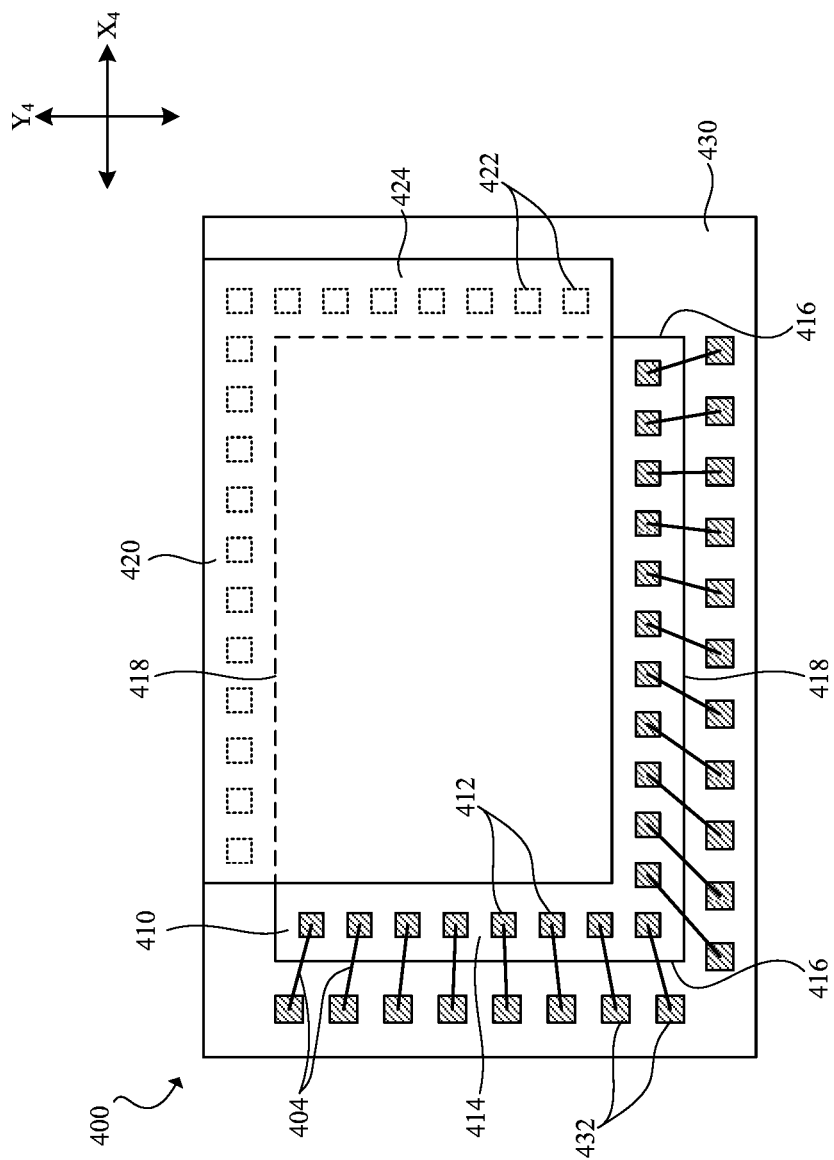
FIG. 4 is a top plan view of a semiconductor device in accordance with an embodiment of the present technology.

The first semiconductor die 110 includes a lower surface 113b facing the package substrate 130 and an upper surface 113a opposite the lower surface 113b. Similarly, the second semiconductor die 120 includes a lower surface 123b facing the upper surface 113a of the first semiconductor die 110 and the package substrate 130, and an upper surface 123a opposite the lower surface 123b. In the embodiment illustrated in FIG. 1A, the second semiconductor die 120 is stacked over the first semiconductor die 110 such that a portion of the lower surface 123b of the second semiconductor die 120 is over (e.g., directly above and/or adjacent to) the upper surface 113a of the first semiconductor die 110. That is, the second semiconductor die 120 is laterally offset from the first semiconductor die 110 such that the second semiconductor die 120 includes an overhang portion 124 that is not positioned over the first semiconductor die 110, and the first semiconductor die 110 includes a corresponding open portion 114 where the second semiconductor die 120 is not positioned over the first semiconductor die 110. More particularly, with reference to FIG. 1B, the first semiconductor die 110 can include opposing first sides 116 and opposing second sides 118, and the second semiconductor die 120 can extend beyond only one of the first sides 116 (shown in phantom in FIG. 1B) of the first semiconductor die 110 (e.g., in a direction along an axis $X_1$ generally parallel to second sides 118) to define the overhang portion 124. In other embodiments (e.g., as shown in FIG. 4), the second semiconductor die 120 can extend beyond more than one of the first sides 116 and/or second sides 118 of the first semiconductor die 110 to define the overhang portion 124.

The size, shape, and relative extent of the open portion 114 of the first semiconductor die 110 and the overhang portion 124 of the second semiconductor die 120 depend at least on the relative dimensions (e.g., width, thickness, and length) and positioning (e.g., lateral offset) of the semiconductor dies 110, 120. As shown in the top plan view of FIG. 1B, for example, the semiconductor dies 110, 120 can each have the same rectangular planform shape with the same or substantially similar dimensions. Accordingly, the open portion 114 and the overhang portion 124 can both have rectangular planform shapes with the same or substantially similar dimensions. However, in other embodiments, the shape, size, and offset of the semiconductor dies 110, 120 can differ. For example, the first semiconductor die 110 and/or second semiconductor die 120 can be circular, square, polygonal, and/or other suitable shapes. Accordingly, the open portion 114 of the first semiconductor die 110 and/or the overhang portion 124 of the second semiconductor die 120 can have different relative shapes and/or sizes.

The first semiconductor die 110 further includes first bond pads 112 on (e.g., exposed at) the upper surface 113a at the open portion 114, and facing away from the package substrate 130. Similarly, the second semiconductor die 120 includes second bond pads 122 on the lower surface 123b at the overhang portion 124, and facing the package substrate 130. That is, the semiconductor dies 110, 120 can be arranged in a face-to-face configuration in which the bond pads of each semiconductor die face opposite directions. As illustrated in FIG. 1B, the first and second bond pads 112, 122 (collectively "bond pads 112, 122"; the bond pads 122 of the second semiconductor die are shown in phantom in FIG. 1B) can each have rectilinear shapes and can be formed in a single column along one side of the semiconductor dies 110, 120, respectively. However, in other embodiments, the bond pads 112, 122 can have any other shape or configuration. For example, the bond pads 112, 122 can be circular, polygonal, etc., and may be arranged in multiple rows and/or columns, along more than one side of the semiconductor dies 110, 120, etc.

As shown in FIG. 1A, the device 100 includes only two semiconductor dies. However, in other embodiments, the device 100 may include any number of semiconductor dies. For example, the device 100 may include one or more additional semiconductor dies stacked on the first semiconductor die 110 and/or second semiconductor die 120, or the device 100 may have other semiconductor dies coupled to the package substrate 130 adjacent to the first semiconductor die 110 and/or second semiconductor die 120.

Referring again to FIG. 1A, the device 100 can further include a first die-attach material 142 formed at least partially between the lower surface 113b of the first semiconductor die 110 and the package substrate 130, and a second die-attach material 144 formed at least partially between the upper surface 113a of the first semiconductor die 110 and the lower surface 123b of the second semiconductor die 120. The first and second die-attach materials 142, 144 can be, for example, adhesive films (e.g. die-attach films), epoxies, tapes, pastes, or other suitable materials. In some embodiments, the first and second die-attach materials 142, 144 are the same material and/or have the substantially the same thickness. As shown in the embodiment of FIG. 1A, the second die-attach material 144 can extend at least partially onto the overhang portion 124 of the second semiconductor die 120. However, in other embodiments, the second die-attach material 144 can extend only between the first semiconductor die 110 and the second semiconductor die 120. Likewise, in some embodiments, the second die-attach material 144 can extend at least partially onto the open portion 114 of the first semiconductor die 110.

The package substrate 130 can include a redistribution structure, an interposer, a printed circuit board, a dielectric spacer, another semiconductor die (e.g., a logic die), or another suitable substrate. More specifically, in the embodiment illustrated in FIG. 1A, the package substrate 130 has a first side 133a and a second side 133b opposite the first side 133a, and includes an insulating material 135 that insulates conductive portions of the package substrate 130. The conductive portions of the package substrate can include first contacts 132 and second contacts 134 in and/or on the insulating material 135 and exposed at the first surface 133a. As is more clearly illustrated in FIG. 1B, the first contacts 132 are spaced laterally outward from (e.g., outboard of) one of the first sides 116 of the first semiconductor die 110. The second contacts 134 (obscured in FIG. 1B) can be spaced laterally outward from the other of the first sides 116 and below the overhang portion 124 of the second semiconductor die 120. In some embodiments, the second contacts 134 are vertically aligned with (e.g. superimposed below) the second bond pads 122 of the second semiconductor die 120.

The conductive portions of the package substrate 130 can also include (a) conductive third contacts 136 in and/or on the insulating material 135 and exposed at the second surface 133b of the package substrate 130, and (b) conductive lines 138 (e.g., vias and/or traces) extending within and/or on the insulating material 135 to electrically couple individual ones of the first contacts 132 and second contacts 134 to corresponding ones of the third contacts 136. In some embodiments, one or more of the third contacts 136 can be positioned laterally outboard of (e.g., fanned out from) the corresponding first contacts 132 or second contacts 134 to which the third contacts 136 are electrically coupled. Positioning at least some of the third contacts 136 laterally outboard of the first contacts 132 and/or second contacts 134 facilitates connection of the device 100 to other devices and/or interfaces having connections with a greater pitch than that of the first semiconductor die 110 and/or second semiconductor die 120. In some embodiments, an individual one of the third contacts 136 can be electrically coupled, via corresponding conductive lines 138, to more than one of the first contacts 132 and/or second contacts 134. In this manner, the device 100 may be configured such that individual pins of the semiconductor dies 110, 120 are individually isolated and accessible (e.g., signal pins) via separate third contacts 136, and/or configured such that multiple pins are collectively accessible via the same third contact 136 (e.g., power supply or ground pins). In certain embodiments, the first contacts 132, second contacts 134, third contacts 136, and conductive lines 138 can be formed from one or more conductive materials such as copper, nickel, solder (e.g., SnAg-based solder), conductor-filled epoxy, and/or other electrically conductive materials.

In some embodiments, the package substrate 130 is a redistribution structure that does not include a pre-formed substrate (i.e., a substrate formed apart from a carrier wafer and then subsequently attached to the carrier wafer). In such embodiments, and as described in further detail below with reference to FIGS. 2A-2D, the insulating material 135 can comprise, for example, one or more layers of a suitable dielectric material (e.g., a passivation material) that are additively formed one layer on top of another. Likewise, the conductive portions of the redistribution structure can be additively formed via a suitable build-up process. In embodiments in which the redistribution structure does not include a pre-formed substrate, the package substrate 130 can be very thin. For example, in some such embodiments, a distance D between the first and second surfaces 133a, 133b of the package substrate 130 can be less than 50 µm. In certain embodiments, the distance D is approximately 30 µm, or less than 30 µm. Therefore, the overall size of the semiconductor device 100 can be reduced as compared to, for example, devices including a conventional redistribution layer formed over a pre-formed substrate. However, the thickness of the package substrate 130 is not limited. In other embodiments, the package substrate 130 can include different features and/or the features can have a different arrangement.

The device 100 further includes electrical connectors 108 (e.g., solder balls, conductive bumps, conductive pillars, conductive epoxies, and/or other suitable electrically conductive elements) electrically coupled to the third contacts 136 of the package substrate 130 and configured to electrically couple the device 100 to external devices or circuitry (not shown). In some embodiments, the electrical connectors 108 form a ball grid array on the second surface 133b of the package substrate 130. In certain embodiments, the electrical connectors 108 can be omitted and the third contacts 136 can be directly connected to external devices or circuitry.

The device 100 further includes (a) wirebonds 104 electrically coupling the first bond pads 112 of the first semiconductor die 110 to the first contacts 132 of the package substrate 130, and (b) conductive features 106 electrically coupling the second bond pads 122 of the second semiconductor die 120 to the second contacts 134 of the package substrate 130. Notably, in the embodiment illustrated in FIG. 1A, a maximum height of the wire bonds 104 above the package substrate 130 (or, e.g., the upper surface 113a of the first semiconductor die 110) is not greater than a height of the second semiconductor die 120 above the same. That is, the wire bonds 104 do not extend upward beyond a plane coplanar with the upper surface 123a of the second semiconductor die 120. Moreover, as illustrated in the top plan view of FIG. 1B, each first contact 132 can be electrically coupled to only a single one of the bond pads 112 of the first semiconductor die 110 via a single one of the wire bonds 104. However, in other embodiments, individual ones of the first contacts 132 can be electrically coupled via two or more wire bonds 104 to two or more of the first bond pads 112 (e.g., for providing a common signal to two pins of the first semiconductor die 110). The conductive features 106 can have various suitable structures, such as pillars, columns, studs, bumps, etc., and can be made from copper, nickel, solder (e.g., SnAg-based solder), conductor-filled epoxy, and/or other electrically conductive materials. In certain embodiments, the conductive features 106 are solder-joints, while in certain embodiments the conductive features 106 are copper pillars. In other embodiments, the conductive features 106 can include more complex structures, such as bump-on-nitride structures, or other known flip-chip mounting structures.

Notably, the second semiconductor die 120 need not be directly electrically interconnected with or through the first semiconductor die 110 since the second semiconductor die 120 is directly connected to the package substrate 130. In contrast, many conventional semiconductor devices require relatively complex and expensive interconnection structures for coupling stacked semiconductor dies to a package substrate. For example, many known semiconductor devices include through-silicon vias (TSVs) that extend through lower semiconductor dies in a stack to electrically connect upper dies in the stack to a package substrate. Such devices not only require the formation of TSVs, but also the formation of interconnects (e.g., under bump metallization features, solder connections, etc.) for connecting the TSVs of adjacent semiconductor dies in the stack. Likewise, many known semiconductor devices include stacked semiconductor dies that are arranged face-to-face and flip-chip bonded together. Again, such devices require the formation of interconnect structures that connect the bond pads of facing dies and, in many instances, the formation of a redistribution layer (RDL) between the semiconductor dies to provide a suitable mapping between the bond pads of each die. The device 100 described herein does not require direct electrical interconnection between the semiconductor dies 110, 120, and therefore avoids the cost and complexity associated with associated interconnection structures. For example, in lieu of forming a RDL between the semiconductor dies 110, 120, the device 100 can simply include the second die-attach material 144 between the semiconductor dies 110, 120.

As further shown in FIG. 1A, the device 100 includes a molded material 146 over the first side 133a of the package substrate 130 (the molded material 146 is not shown in FIG. 1B for ease of illustration). The molded material 146 at least partially surrounds the first semiconductor die 110, the second semiconductor die 120, the wire bonds 104, and/or the conductive features 106 to protect one or more of these components from contaminants and/or physical damage. For example, in the embodiment illustrated in FIG. 1A, the molded material 146 encapsulates (e.g., seals) the first semiconductor die 110, wire bonds 104, and conductive features 106, while only the upper surface 123a of the second semiconductor die 120 is exposed from the molded material 146.

Notably, the molded material 146 does not extend above the second semiconductor die 120 relative to the package substrate 130 (e.g., above a plane coplanar with the upper surface 123a of the second semiconductor die 120), while also substantially encapsulating the wire bonds 104 and conductive features 106. In contrast, many conventional semiconductor devices include a stack of semiconductor dies each wire-bonded to a package substrate. In such devices, the wire bonds of the uppermost semiconductor die in the stack extend beyond the uppermost die to connect to the bond pads of that die (e.g., in a manner similar to the wire bonds 104 in FIG. 1A, which include a "loop-height" above the upper surface 113a of the first semiconductor die 110). However, because the second semiconductor die 120 is directly electrically coupled to the package substrate 130 via the conductive features 106—rather than via wire bonds—the molded material 146 need not extend above the second semiconductor die 120.

Accordingly, the height (e.g., thickness) of the device 100 and the total amount of molded material 146 used in the device 100 may be reduced. Reducing the amount of molded material 146 in the device 100 can reduce the tendency of the device 100 to warp in response to changing temperatures. In particular, molded materials generally have a greater coefficient of thermal expansion (CTE) than silicon semiconductor dies. Therefore, reducing the volume of the molded material 146 by reducing the height of the molded material can lower the overall average CTE for the device 100 (e.g., by increasing the relative volume occupied by the semiconductor dies 110, 120). However, in other embodiments, the molded material 146 may extend above the second semiconductor die 120. For example, in some embodiments, the molded material 146 can extend slightly above the second semiconductor die 120 so as to cover the upper surface 123a, while still reducing the overall height of the device 100 as compared to, for example, a semiconductor device in which the uppermost semiconductor die is wire bonded to a package substrate.

Furthermore, in some embodiments, the molded material 146 can at least partially fill the space below the overhang portion 124 of the second semiconductor die 120. The molded material 146 can therefore support the overhang portion 124 to prevent warpage of, or other damage to, the second semiconductor die 120 resulting from external forces. Moreover, in embodiments where the package substrate 130 is a redistribution structure that does not include a pre-formed substrate, the molded material 146 can also provide the desired structural strength for the device 100. For example, the molded material 146 can be selected to prevent the device 100 from warping, bending, etc., as external forces are applied to the device 100. As a result, in some embodiments, the redistribution structure can be made very thin (e.g., less than 50 μm) since the redistribution structure need not provide the device 100 with a great deal of structural strength. Therefore, the overall height (e.g., thickness) of the device 100 can further be reduced.

FIGS. 2A-2J are cross-sectional views illustrating various stages in a method of manufacturing semiconductor devices 100 in accordance with embodiments of the present technology. Generally, a semiconductor device 100 can be manufactured, for example, as a discrete device or as part of a larger wafer or panel. In wafer-level or panel-level manufacturing, a larger semiconductor device is formed before being singulated to form a plurality of individual devices. For ease of explanation and understanding, FIGS. 2A-2J illustrate the fabrication of two semiconductor devices 100. However, one skilled in the art will readily understand that the fabrication of semiconductor devices 100 can be scaled to the wafer and/or panel level—that is, to include many more components so as to be capable of being singulated into more than two semiconductor devices 100—while including similar features and using similar processes as described herein.

FIGS. 2A-2D, more specifically, illustrate the fabrication of a package substrate for the semiconductor devices 100 (FIG. 1A) that is a redistribution structure that does not include a pre-formed substrate. In other embodiments, a different type of package substrate (e.g., an interposer, a printed circuit board, etc.) can be provided for the semiconductor devices 100, and the method of manufacturing the semiconductor devices 100 can begin at, for example, the stage illustrated in FIG. 2E after providing the package substrate.

Figure 2A:
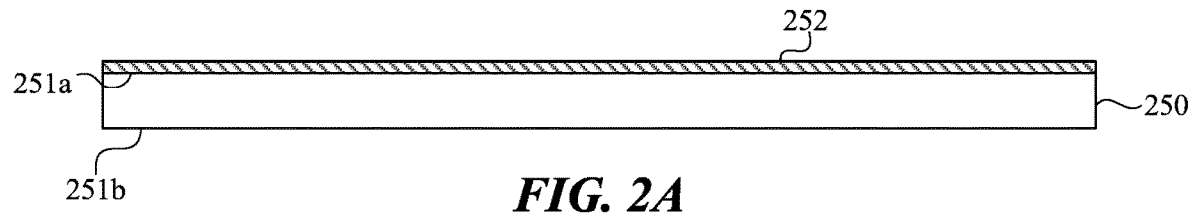
FIGS. 2A-2J are cross-sectional views illustrating a semiconductor device at various stages of manufacturing in accordance with embodiments of the present technology.
Figure 2B:
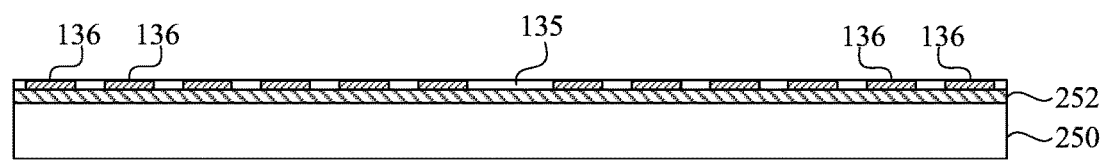

Referring to FIG. 2A, the package substrate 130 (i.e., the redistribution structure) is formed on a carrier 250 having a back side 251b and a front side 251a including a release layer 252 formed thereon. The carrier 250 provides mechanical support for subsequent processing stages and can be a temporary carrier formed from, for example, silicon, silicon-on-insulator, compound semiconductor (e.g., Gallium Nitride), glass, or other suitable materials. In some embodiments, the carrier 250 can be reused after it is subsequently removed. The carrier 250 also protects a surface of the release layer 252 during the subsequent processing stages to ensure that the release layer 252 can later be properly removed from the package substrate 130. The release layer 252 prevents direct contact of the package substrate 130 with the carrier 250 and therefore protects the package substrate 130 from possible contaminants on the carrier 250. The release layer 252 can be a disposable film (e.g., a laminate film of epoxy-based material) or other suitable material. In some embodiments, the release layer 252 is laser-sensitive or photo-sensitive to facilitate its removal at a subsequent stage.

Figure 2C:
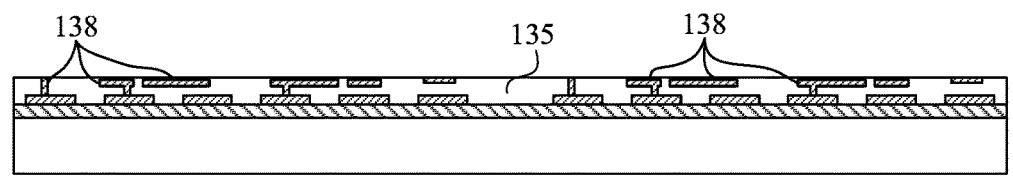

The package substrate 130 (FIG. 1A) includes conductive and dielectric materials that can be formed from an additive build-up process. That is, the package substrate 130 is additively built directly on the carrier 250 and the release layer 252 rather than on another laminate or organic substrate. Specifically, the package substrate 130 is fabricated by semiconductor wafer fabrication processes such as sputtering, physical vapor deposition (PVD), electroplating, lithography, etc. For example, referring to FIG. 2B, the third contacts 136 can be formed directly on the release layer 252, and a layer of insulating material 135 can be formed on the release layer 252 to electrically isolate the third contacts 136. The insulating material 135 may be formed from, for example, parylene, polyimide, low temperature chemical vapor deposition (CVD) materials—such as tetraethylorthosilicate (TEOS), silicon nitride ($Si_3Ni_4$), silicon oxide ($SiO_2$)—and/or other suitable dielectric, non-conductive materials. Referring to FIG. 2C, one or more additional layers of insulating material can be formed to build up the insulating material 135, and one or more additional layers of conductive material can be formed to build up the conductive lines 138 on and/or within the insulating material 135.

Figure 2D:
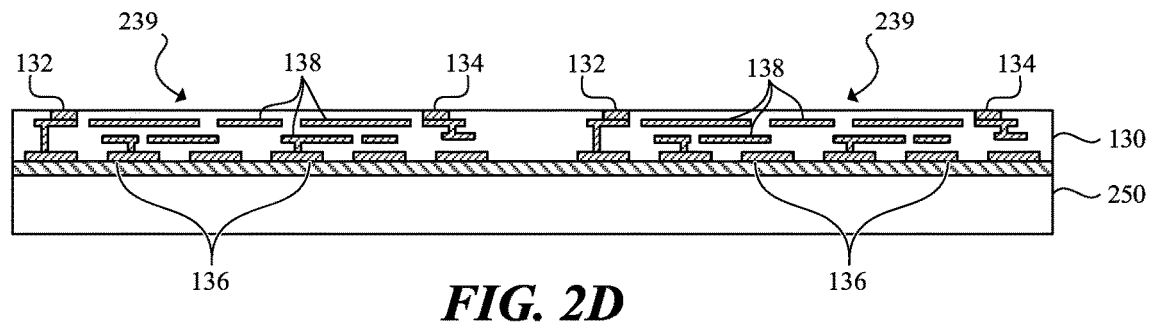

FIG. 2D shows the package substrate 130 after being fully formed over the carrier 250. As described above, the first contacts 132 and second contacts 134 are formed to be electrically coupled to corresponding ones of the third contacts 136 via one or more of the conductive lines 138. The first contacts 132, second contacts 134, third contacts 136, and the conductive lines 138 can be made from copper, nickel, solder (e.g., SnAg-based solder), conductor-filled epoxy, and/or other electrically conductive materials. In some embodiments, these conductive portions are all made from the same conductive material. In other embodiments, the first contacts 132, second contacts 134, third contacts 136, and/or conductive lines 138 can comprise more than one conductive material. The first contacts 132 and second contacts 134 can be arranged to define die-attach areas 239 on the package substrate 130.

Figure 2E:
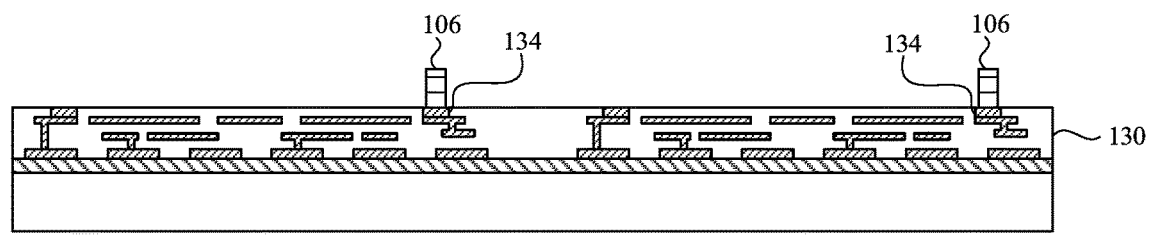

Referring to FIG. 2E, fabrication of the semiconductor devices 100 continues by forming the conductive features 106 on the second contacts 134 of the package substrate 130. The conductive features 106 can be fabricated by a suitable electroplating or electroless plating technique, as is well known in the art. In other embodiments, other deposition techniques (e.g., sputter deposition) can be used in lieu of electroplating. In yet other embodiments, the conductive features 106 may comprise solder balls or solder bumps disposed on the second contacts 134. The conductive features 106 can have a circular, rectangular, hexagonal, polygonal, or other cross-sectional shape, and can be single layer or multi-layer structures.

Figure 2F:
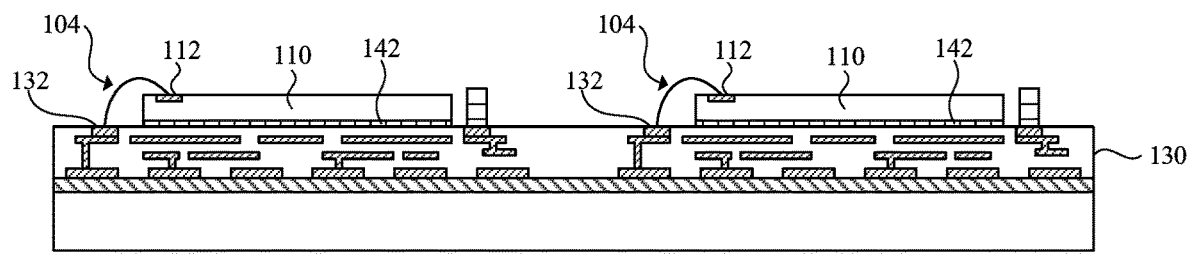

Referring to FIG. 2F, fabrication of the semiconductor devices 100 continues with (a) coupling the first semiconductor dies 110 to corresponding ones of the die-attach areas 239 (FIG. 2D) of the package substrate 130, and (b) forming the wire bonds 104 such that they electrically couple the first bond pads 112 of the first semiconductor dies 110 to the first contacts 132 of the package substrate 130. More particularly, the first semiconductor dies 110 can be attached to the die-attach areas 239 of the package substrate via the first die-attach material 142. The first die-attach material 142 can be a die-attach adhesive paste or an adhesive element, for example, a die-attach film or a dicing-die-attach film (known to those skilled in the art as "DAF" or "DDF," respectively). In some embodiments, the first die-attach material 142 can include a pressure-set adhesive element (e.g., tape or film) that adheres the first semiconductor dies 110 to the package substrate 130 when it is compressed beyond a threshold level of pressure. In other embodiments, the first die-attach material 142 can be a UV-set tape or film that is set by exposure to UV radiation.

Figure 2G:
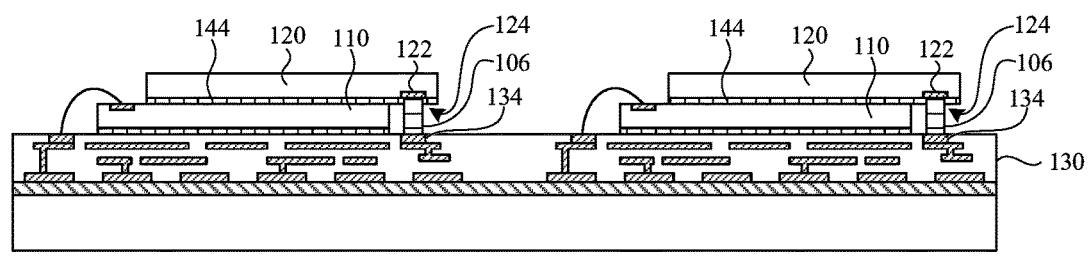

FIG. 2G shows the semiconductor devices 100 after the second semiconductor dies 120 have been stacked over the first semiconductor dies 110 and coupled to the conductive features 106. More specifically, the second semiconductor dies 120 can be flip-chipped bonded to the package substrate 130 such that the second bond pads 122 of the second semiconductor dies 120 are electrically coupled to corresponding ones of the second contacts 134 of the package substrate 130 via the conductive features 106. In some embodiments, the second bond pads 122 are coupled to the conductive features 106 using solder or a solder paste. In other embodiments, another process such as thermo-compression bonding (e.g., copper-copper (Cu—Cu) bonding) can be used to form conductive Cu—Cu joints between the second bond pads 122 and the conductive features 106.

The second semiconductor dies 120 can be attached to at least a portion of the first semiconductor dies 110 via the second die-attach material 144. As described above, no electrical interconnections (e.g., metallization features, solder bumps, RDLs, etc.) need be formed between the semiconductor dies 110, 120. The second die-attach material 144 can be generally similar to the first die-attach material 142 (e.g., a DAF, DDF, etc.) and, in some embodiments, is the same material as the first die-attach material 142 and/or has the same thickness as the first die-attach material 142. In the embodiment illustrated in FIG. 2G, the second die-attach material 144 extends onto the overhang portions 124 of the second semiconductor dies 120. In some such embodiments, the second die-attach material 144 is peeled back from, or otherwise removed from or prevented from covering the second bond pads 122 of the second semiconductor dies 120 prior to coupling the second bond pads 122 to the conductive features 106. In other embodiments, the second die-attach material 144 is not formed on or is entirely removed from the overhang portions 124.

Figure 2H:
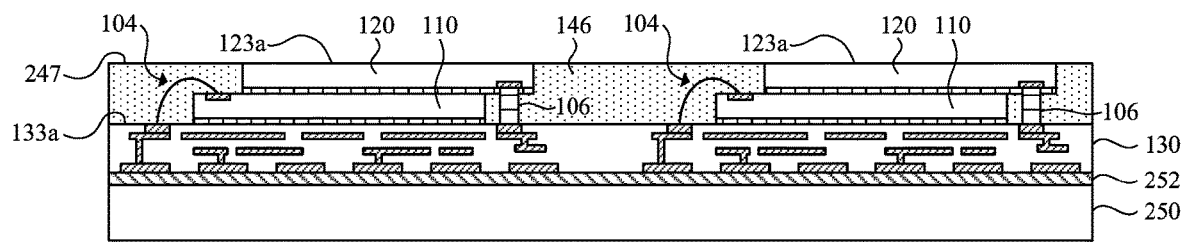

FIG. 2H shows the semiconductor devices 100 after disposing the molded material 146 on the first surface 133a of the package substrate 130 and at least partially around the first semiconductor dies 110, the wire bonds 104, the second semiconductor dies 120, and/or the conductive features 106. The molded material 146 may be formed from a resin, epoxy resin, silicone-based material, polyimide, and/or other suitable resin used or known in the art. Once deposited, the molded material 146 can be cured by UV light, chemical hardeners, heat, or other suitable curing methods known in the art. The cured molded material 146 can include an upper surface 247. In the embodiment illustrated in FIG. 2H, the upper surface 247 is generally coplanar with the upper surfaces 123a of the second semiconductor dies 120 such that the upper surfaces 123a are not covered by the molded material 146. In some embodiments, the molded material 146 is formed in one step such that the upper surfaces 123a of the second semiconductor dies 120 are exposed at the upper surface 247 of the molded material 146. In other embodiments, the molded material 146 is formed and then ground back to planarize the upper surface 247 and to thereby expose the upper surfaces 123a of the second semiconductor dies 120. As further shown in FIG. 2H, in some embodiments, the molded material 146 encapsulates the first semiconductor dies 110, wire bonds 104, and conductive features 106 such that these features are sealed within the molded material 146.

Figure 2I:
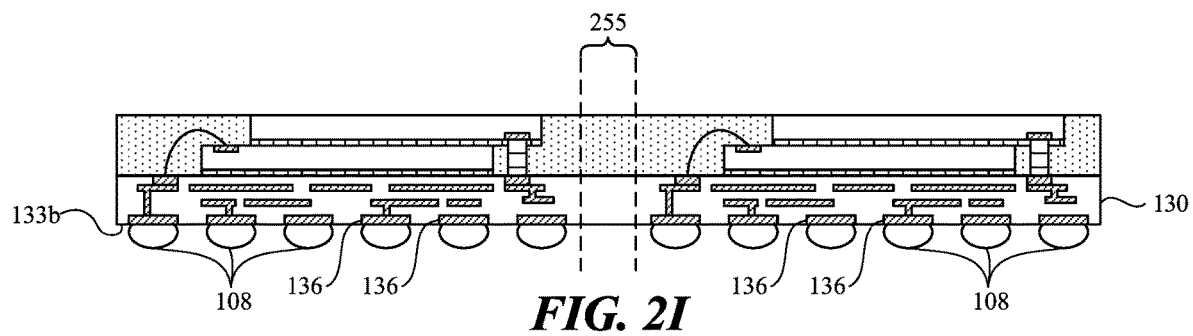

FIG. 2I illustrates the semiconductor devices 100 after (a) separating the package substrate 130 from the carrier 250 (FIG. 2H) and (b) forming the electrical connectors 108 on the third contacts 136 of the package substrate 130. In some embodiments, a vacuum, poker pin, laser or other light source, or other suitable method known in the art can detach the package substrate 130 from the release layer 252 (FIG. 2H). In certain embodiments, the release layer 252 (FIG. 2H) allows the carrier 250 to be easily removed such that the carrier 250 can be reused again. In other embodiments, the carrier 250 and release layer 252 can be at least partially removed by thinning the carrier 250 and/or release layer 252 (e.g., using back grinding, dry etching processes, chemical etching processes, chemical mechanical polishing (CMP), etc.). Removing the carrier 250 and release layer 252 exposes the second surface 133b of the package substrate 130, including the third contacts 136. The electrical connectors 108 are formed on the third contacts 136 and can be configured to electrically couple the third contacts 136 to external circuitry (not shown). In some embodiments, the electrical connectors 108 comprise a plurality of solder balls or solder bumps. For example, a stenciling machine can deposit discrete blocks of solder paste onto the third contacts 136 that can then be reflowed to form the solder balls or solder bumps on the third contacts 136.

Figure 2J:
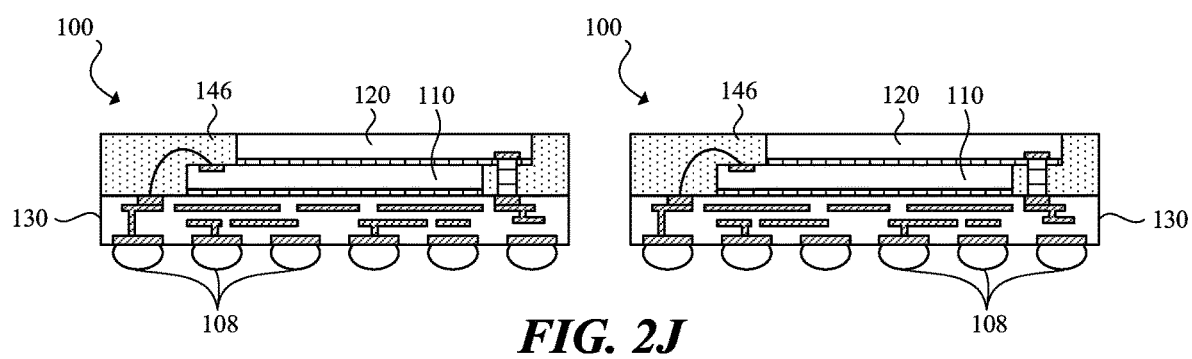

FIG. 2J shows the semiconductor devices 100 after being singulated from one another. As shown, the package substrate 130 and the molded material 146 can be cut at a plurality of dicing lanes 255 (illustrated in FIG. 2I) to singulate the stacked semiconductor dies 110, 120 and to separate the semiconductor devices 100 from one another. Once singulated, the individual semiconductor devices 100 can be attached to external circuitry via the electrical connectors 108 and thus incorporated into a myriad of systems and/or devices.

Figure 3A:
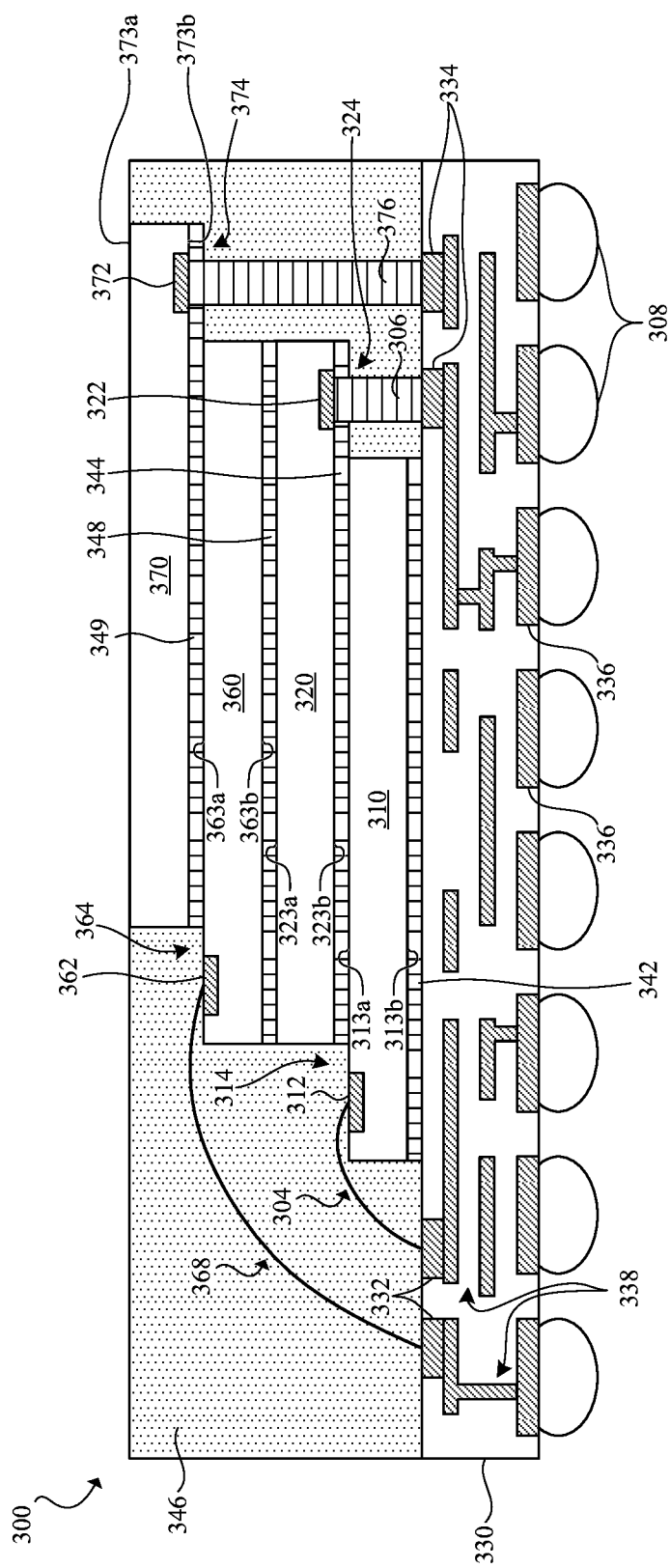
FIGS. 3A and 3B are a cross-sectional view and top plan view, respectively, illustrating a semiconductor device in accordance with embodiments of the present technology.
Figure 3B:
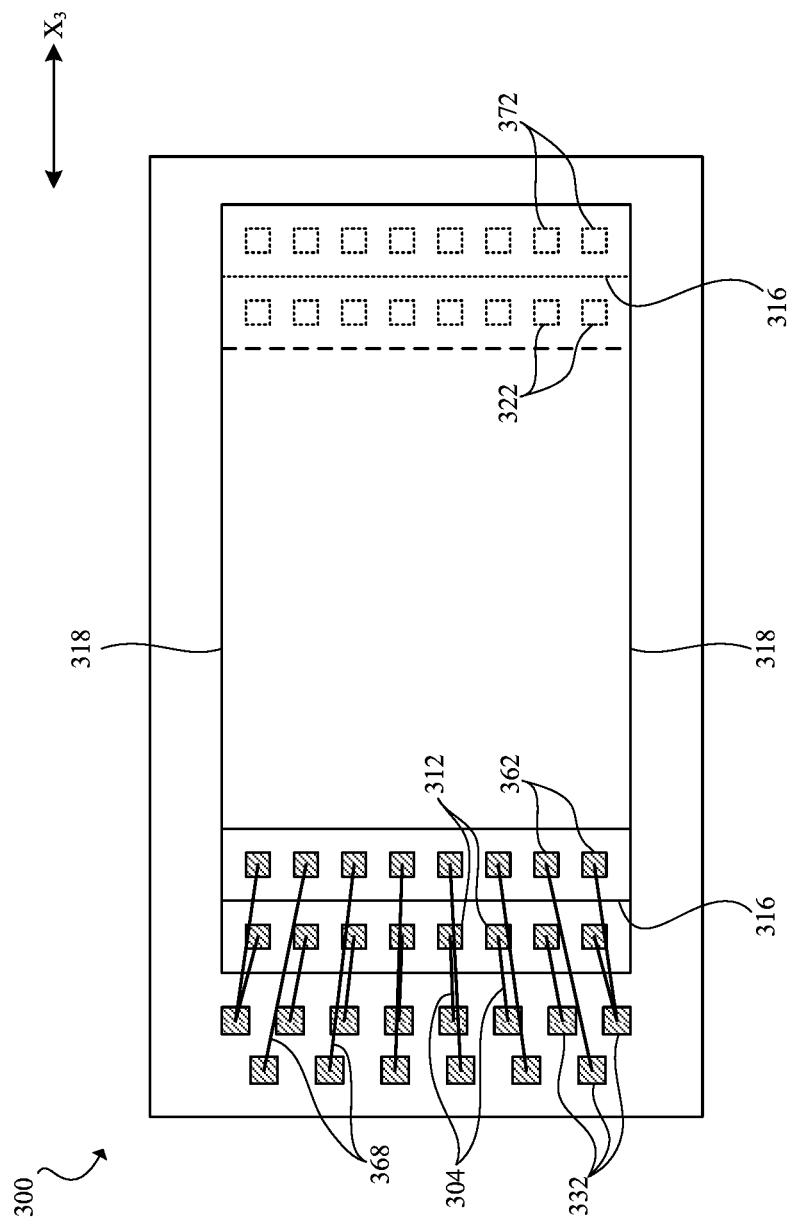

FIG. 3A is a cross-sectional view, and FIG. 3B is a top plan view, illustrating a semiconductor device 300 ("device 300") in accordance with another embodiment of the present technology. This example more specifically shows another semiconductor device configured in accordance with the present technology having more than two stacked semiconductor dies. The device 300 can include features generally similar to those of the semiconductor device 100 described in detail above. For example, in the embodiment illustrated in FIG. 3A, the device 300 includes a first semiconductor die 310 and a second semiconductor die 320 (collectively "semiconductor dies 310, 320") carried by a package substrate 330 (e.g., a redistribution structure that does not include a preformed substrate). More specifically, the second semiconductor die 320 is stacked over and laterally offset from the first semiconductor die 310 to define an overhang portion 324 of the second semiconductor die 320 and an open portion 314 of the first semiconductor die 310. The first semiconductor die 310 has a lower surface 313b attached to the package substrate 330 via a first die-attach material 342, and an upper surface 313a facing the second semiconductor die 320 and having first bond pads 312 exposed at the open portion 314 of the first semiconductor die 310. The second semiconductor die 320 has a lower surface 323b partially attached to the upper surface 313a of the first semiconductor die 310 via a second die-attach material 344, and an upper surface 323a opposite the lower surface 323b. The second semiconductor die 320 further includes second bond pads 322 on the lower surface 323b, exposed at the overhang portion 324 of the second semiconductor die 320, and facing the package substrate 330. The package substrate 330 includes first contacts 332 and second contacts 334. First wire bonds 304 electrically couple the first bond pads 312 to the first contacts 332 of the package substrate 330, and first conductive features 306 electrically couple the second bond pads 322 to the second contacts 334 of the package substrate 330. The first and second contacts 332 and 334 are electrically coupled to corresponding third contacts 336 of the package substrate via conductive lines 338.

The device 300 further includes a third semiconductor die 360 and a fourth semiconductor die 370 (collectively "semiconductor dies 360, 370") stacked over the semiconductor dies 310, 320. The semiconductor dies 360, 370 can be arranged generally similarly to the semiconductor dies 110, 120 (FIG. 1) and the semiconductor dies 310, 320. For example, as illustrated in the embodiment of FIG. 3A, the fourth semiconductor die 370 can be laterally offset from the third semiconductor die 360 to define an overhang portion 374 of the fourth semiconductor die 370 and an open portion 364 of the third semiconductor die 360. More particularly, with reference to FIG. 3B, the third semiconductor die 360 can have opposing first sides 316 and opposing second sides 318. As shown, the fourth semiconductor die 370 can extend beyond only one of the first sides 316 (shown in phantom in FIG. 3B) of the third semiconductor die 360 (e.g., in a direction along an axis $X_3$ generally parallel to second sides 318) to define the overhang portion 374. In some embodiments, the amount (e.g., a distance along the axis $X_3$) of lateral offset off the semiconductor dies 360, 370 is the same or substantially the same as the lateral offset off the semiconductor dies 310, 320. Moreover, as is more clearly illustrated in the top plan view of FIG. 3B, the semiconductor dies 310, 320 and semiconductor dies 360, 370 can be laterally offset in the same or substantially the same direction (e.g., in a direction along the axis $X_3$). In other embodiments, the semiconductor dies 310, 320 and the semiconductor dies 360, 370 can be offset in more than one direction or by different amounts (e.g., the overhang portion 324 of the second semiconductor die 320 and the overhang portion 374 of the fourth semiconductor die 370 can have different shapes, orientations, and/or dimensions).

The third semiconductor die 360 has a lower surface 363b attached to the upper surface 323a of the second semiconductor die 320 via a third die-attach material 348, and an upper surface 363a facing the fourth semiconductor die 370 and having third bond pads 362 exposed at the open portion 364 of the third semiconductor die 360. The fourth semiconductor die 370 has an upper surface 373a and a lower surface 373b that is partially attached to the upper surface 363a of the third semiconductor die 360 via a fourth die-attach material 349. The lower surface 373b of the fourth semiconductor die 370 includes fourth bond pads 372 at the overhang portion 374. The fourth bond pads 372 are positioned over (e.g., vertically aligned with, superimposed over, etc.) at least a portion of the second contacts 334 of the package substrate 330.

The device 300 further includes (a) second wirebonds 368 electrically coupling the third bond pads 362 of the third semiconductor die 360 to corresponding ones of the first contacts 332 of the package substrate 330, and (b) second conductive features 376 electrically coupling the fourth bond pads 372 of the fourth semiconductor die 370 to corresponding ones of the second contacts 334 of the package substrate 330. In certain embodiments, a maximum height of the second wire bonds 368 above the package substrate 330 and/or above the upper surface 363a of the third semiconductor die 360 is not greater than a height of the fourth semiconductor die 370 above the same. As illustrated in the embodiment of FIG. 3B, the first contacts 332 and second contacts 334 (not pictured; below the second and fourth bond pads 322, 372 shown in phantom) can be arranged in one or more columns (e.g., two columns), and can each be coupled to one or more of the bond pads of the various semiconductor dies. In other embodiments, the arrangement of the first and second contacts 332, 334 can have any other suitable configuration (e.g., arranged in one column, in rows, offset rows and/or columns, etc.). The first and second conductive features 306, 376 can have various suitable structures, such as pillars, columns, studs, bumps, etc., and can be made from copper, nickel, solder (e.g., SnAg-based solder), conductor-filled epoxy, and/or other electrically conductive materials.

Notably, each semiconductor die in the device 300 is directly electrically coupled to the first or second contacts 332 or 334 of the package substrate 330. Therefore, interconnections or other structures are not needed between any of the first semiconductor die 310, second semiconductor die 320, third semiconductor die 360, and fourth semiconductor die 370 (collectively "semiconductor dies 310-370) to electrically connect the semiconductor dies 310-370 to the package substrate 330. In some embodiments, for example, in lieu of interconnection structures (e.g., RDLs) between the semiconductor dies 310-370, the semiconductor dies 310-370 may be coupled together via one or more of the second die-attach material 344, third die-attach material 348, and fourth die-attach material 349. In some embodiments, each of the die-attach materials in the device 300 are the same material and/or have the same thickness.

The device 300 can further include a molded material 346 over an upper surface of the package substrate 330 (the molded material 346 is not shown in FIG. 3B for ease of illustration). In some embodiments, the molded material 346 at least partially surrounds the semiconductor dies 310-370, the first and second wire bonds 304, 368, and/or the first and second conductive features 306, 376 to protect one or more of these components from contaminants and/or physical damage. For example, in the embodiment illustrated in FIG. 3A, only the upper surface 373a of the fourth semiconductor die 370 is exposed from the molded material 346. Notably, the molded material 346 does not extend above the fourth semiconductor die 370 relative to the package substrate 330 (e.g., above a plane coplanar with the upper surface 373a of the fourth semiconductor die 370), while still encapsulating the first and second wire bonds 304, 368 and the first and second conductive features 306, 376. Accordingly, the height (e.g., thickness) of the device 300 may be reduced as compared to, for example, conventional semiconductor devices having wire bonds coupling the uppermost die in the device—and therefore having a wire-loop height above the uppermost die. Likewise, since the molded material 346 need not extend above the upper surface 373a of the fourth semiconductor die 370, the total amount of molded material 346 used in the device 300 can be reduced (e.g., to reduce costs and/or warpage of the device 300).

FIG. 4 is a top plan view of a semiconductor device 400 ("device 400") in accordance with another embodiment of the present technology. This example more specifically illustrates stacked semiconductor dies that are laterally offset along two axes of the semiconductor device. The device 400 can include features generally similar to those of the semiconductor device 100 described in detail above. For example, the device 400 includes a first semiconductor die 410 coupled to a package substrate 430 and a second semiconductor die 420 stacked over and laterally offset from the first semiconductor die 410 (collectively "semiconductor dies 410, 420"). In contrast to many of the embodiments described in detail with reference to FIGS. 1A-3B, the second semiconductor die 420 is laterally offset from two sides of the first semiconductor die 410. More specifically, the first semiconductor die 410 can include opposing first sides 416 and opposing second sides 418. The second semiconductor die 420 can extend beyond (e.g., in a direction along an axis $X_4$ generally parallel to the second sides 418) one of the first sides 416 (partially shown in phantom) and beyond (e.g., in a direction along an axis $Y_4$ generally parallel to the first sides 416) one of the second sides 418 (partially shown in phantom) to define an overhang portion 424 of the second semiconductor die 420 and an open portion 414 of the first semiconductor die 410. In the embodiment illustrated in FIG. 4, both the overhang portion 424 of the second semiconductor die 420 and the open portion 414 of the first semiconductor die 410 have a generally "L-like" shape. In some embodiments, where the semiconductor dies 410, 420 have the same planform shape and dimensions, the dimensions of the open portion 414 and overhang portion 424 can be the same. In other embodiments, the semiconductor dies 410, 420 can have different planform shapes and/or dimensions such that the overhang portion 424 and open portion 414 have different shapes and/or dimensions. For example, where one of the two semiconductor dies 410, 420 is larger than the other, the open portion 414 and/or overhang portion 424 can have a generally "U-like" shape along three edges of the larger die.

As further shown in FIG. 4, the first semiconductor die 410 can have first bond pads 412 on an upper surface of the first semiconductor die 410 and exposed at the open portion 414. Similarly, the second semiconductor die 420 can have second bond pads 422 (shown in phantom) on a lower surface of the second semiconductor die 420, exposed at the overhang portion 424, and facing the package substrate 430. As illustrated in FIG. 4, the first and second bond pads 412, 422 (collectively "bond pads 412, 422") can be arranged in an L-like shape along the open portion 414 of the first semiconductor die 410 and the overhang portion 424 of the second semiconductor die 420, respectively. In other embodiments, the bond pads 412, 422 can have other arrangements (e.g., positioned adjacent only a single side of the semiconductor dies 410, 420, positioned in more than one row and/or column, etc.). In certain embodiments, the semiconductor dies 410, 420 are laterally offset depending on the configuration of the bond pads 412, 422 of the semiconductor devices 410, 420. For example, the offset of the semiconductor dies 410, 420 can be selected such that each of the first bond pads 412 of the first semiconductor die 410 are exposed at the open portion 414, and each of the second bond pads 422 of the second semiconductor die 420 are exposed at the overhang portion 424.

The package substrate 430 can include first contacts 432 and second contacts (obscured in FIG. 4; e.g., vertically aligned below the second bond pads 422). The device 400 further includes wire bonds 404 electrically coupling the first bond pads 412 of the first semiconductor die 410 to the first contacts 432 of the package substrate 430, and conductive features (not pictured; e.g., conductive pillars) electrically coupling the second bond pads 422 of the second semiconductor die 420 to the second contacts of the package substrate 430. The first contacts 432 and second contacts can have any suitable arrangement. For example, in some embodiments, the package substrate 430 is a redistribution structure that does not include a pre-formed substrate and that is additively built up (FIGS. 2A-2D). Accordingly, the package substrate 430 can be a flexible structure that is adaptable to the particular arrangement of the semiconductor dies 410, 420 and the bond pads 412, 422.

Figure 5:
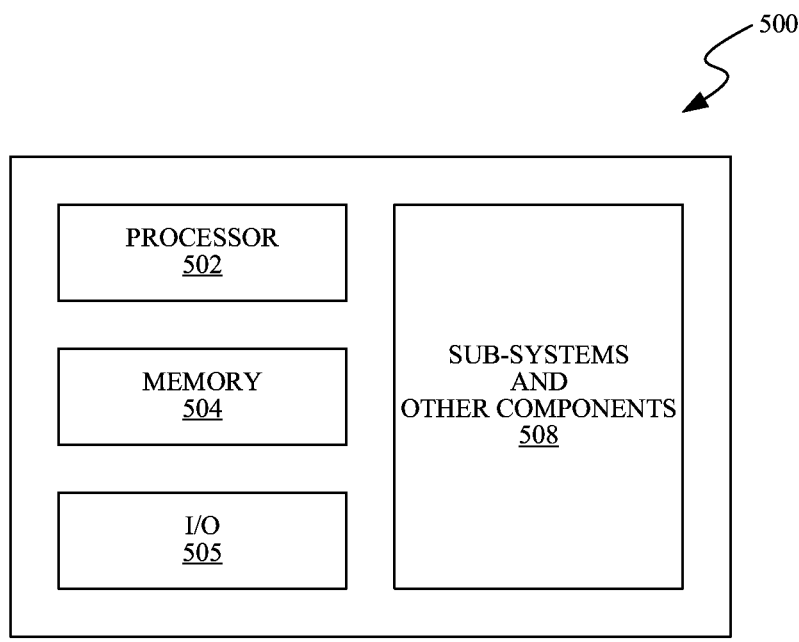
FIG. 5 is a schematic view of a system that includes a semiconductor device configured in accordance with embodiments of the present technology.

Any one of the semiconductor devices having the features described above with reference to FIGS. 1A-4 can be incorporated into any of a myriad of larger and/or more complex systems, a representative example of which is system 500 shown schematically in FIG. 5. The system 500 can include a processor 502, a memory 504 (e.g., SRAM, DRAM, flash, and/or other memory devices), input/output devices 505, and/or other subsystems or components 508. The semiconductor devices described above with reference to FIGS. 1A-4 can be included in any of the elements shown in FIG. 5. The resulting system 500 can be configured to perform any of a wide variety of suitable computing, processing, storage, sensing, imaging, and/or other functions. Accordingly, representative examples of the system 500 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multiprocessor systems, processor-based or programmable consumer electronics, network computers, and minicomputers. Additional representative examples of the system 500 include lights, cameras, vehicles, etc. With regard to these and other example, the system 500 can be housed in a single unit or distributed over multiple interconnected units, e.g., through a communication network. The components of the system 500 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Furthermore, certain aspects of the present technology described in the context of particular embodiments may also be combined or eliminated in other embodiments. For example, the various embodiments described with reference to FIGS. 1A-4 may be combined to incorporate different numbers of stacked semiconductor dies (e.g., three dies, five dies, six dies, eight dies, etc.) that are laterally offset in different manners. Accordingly, the invention is not limited except as by the appended claims. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device, comprising:
   a redistribution structure having an upper surface and a lower surface opposite the upper surface, wherein the redistribution structure does not include a pre-formed substrate between the upper and lower surfaces;
   a first semiconductor die coupled to the redistribution structure and having an upper surface facing away from the redistribution structure, wherein the upper surface of the first semiconductor includes first bond pads;
   first wire bonds electrically coupling the first bond pads of the first semiconductor die to the redistribution structure;
   a second semiconductor die having a lower surface facing the redistribution structure and an upper surface facing away from the redistribution structure, wherein the lower surface of the second semiconductor die is coupled to the upper surface of the first semiconductor die, wherein the second semiconductor die extends laterally beyond at least one side of the first semiconductor die to define an overhang portion of the second semiconductor die, and wherein the lower surface of the second semiconductor die includes second bond pads at the overhang portion;
   conductive features electrically coupling the second bond pads of the second semiconductor die to the redistribution structure;
   a third semiconductor die having a lower surface facing the redistribution structure and an upper surface facing away from the redistribution structure, wherein all of the lower surface of the third semiconductor die is positioned over and coupled to the upper surface of the second semiconductor die, and wherein the upper surface of the third semiconductor die includes third bond pads; and
   second wire bonds electrically coupling the third bond pads of the third semiconductor die to the redistribution structure.

2. The semiconductor device of claim 1 wherein all of the lower surface of the third semiconductor die is directly attached to the upper surface of the second semiconductor die via a die-attach material.

3. The semiconductor device of claim 1 wherein the second and third semiconductor dies have the same planform shape and dimensions.

4. The semiconductor device of claim 1 wherein the upper surface of the second semiconductor die and the lower surface of the third semiconductor die have the same shape and dimensions such that all of the lower surface of the third semiconductor die is directly adjacent to the upper surface of the second semiconductor die.

5. The semiconductor device of claim 1, further comprising:
   a fourth semiconductor die having a lower surface facing the redistribution structure and an upper surface facing away from the redistribution structure, wherein the lower surface of the fourth semiconductor die is coupled to the upper surface of the third semiconductor die, wherein the fourth semiconductor die extends laterally beyond at least one side of the third semiconductor die to define an overhang portion of the fourth semiconductor die, and wherein the lower surface of the fourth semiconductor die includes fourth bond pads at the overhang portion of the fourth semiconductor die; and
   second conductive features electrically coupling the fourth bond pads of the fourth semiconductor die to the redistribution structure.

6. The semiconductor device of claim 5, further comprising a molded material over the redistribution structure, wherein the molded material does not extend away from the redistribution structure beyond a plane coplanar with the upper surface of the fourth semiconductor die.

7. The semiconductor device of claim 5 wherein the overhang portions of the second and fourth semiconductor dies have the same shape and dimensions.

8. The semiconductor device of claim 5 wherein the second semiconductor die extends laterally beyond the at least one side of the first semiconductor die in a direction, and wherein the fourth semiconductor die extends laterally beyond the at least one side of the third semiconductor in the same direction.

9. The semiconductor device of claim 5 wherein the first and second conductive features are conductive pillars.

10. The semiconductor device of claim 5 wherein the first semiconductor die includes opposing first sides and opposing second sides, and wherein the second semiconductor die extends laterally beyond only one of the first sides or one of the second sides of the first semiconductor die.

11. The semiconductor device of claim 10 wherein the third semiconductor die includes opposing first sides and opposing second sides, and wherein the fourth semiconductor die extends laterally beyond only one of the first sides or one of the second sides of the third semiconductor die.

12. The semiconductor device of claim 10 wherein the fourth semiconductor die extends laterally beyond one of the one of the first sides and one of the second sides of the first semiconductor die.

13. The semiconductor device of claim 1 wherein the first semiconductor die, the second semiconductor die, the third semiconductor die, and the fourth semiconductor die are identical, and wherein an arrangement of the first bond pads on the first semiconductor die is identical to an arrangement of (a) the second bond pads on the second semiconductor die, (b) the third bond pads on the third semiconductor die, and (c) the fourth bond pads on the fourth semiconductor die.

14. The semiconductor device of claim 1 wherein the first semiconductor die includes a pair of opposing sides, and wherein the second semiconductor die is laterally offset from the first semiconductor die only along an axis extending between and parallel to the pair of opposing sides.

15. The semiconductor device of claim 1 wherein a thickness of the redistribution structure between the upper and lower surfaces is less than about 50 μm.

16. The semiconductor device of claim 1 wherein the redistribution structure includes a plurality of layers of conductive and dielectric material formed from an additive build-up process.

17. A semiconductor device, comprising:
a redistribution structure having an upper surface and a lower surface opposite the upper surface, wherein the redistribution structure does not include a pre-formed substrate between the upper and lower surfaces;
a first semiconductor die coupled to the redistribution structure and having an upper surface facing away from the redistribution structure, wherein the upper surface of the first semiconductor includes first bond pads;
first wire bonds electrically coupling the first bond pads of the first semiconductor die to the redistribution structure;
a second semiconductor die having a lower surface facing the redistribution structure and an upper surface facing away from the redistribution structure, wherein the lower surface of the second semiconductor die is coupled to the upper surface of the first semiconductor die, wherein the second semiconductor die extends in a direction laterally beyond at least one side of the first semiconductor die to define an overhang portion of the second semiconductor die, and wherein the lower surface of the second semiconductor die includes second bond pads at the overhang portion;
first conductive columns electrically coupling the second bond pads of the second semiconductor die to the redistribution structure;
a third semiconductor die having a lower surface facing the redistribution structure and an upper surface facing away from the redistribution structure, wherein all of the lower surface of the third semiconductor die is positioned over and coupled to the upper surface of the second semiconductor die, and wherein the upper surface of the third semiconductor die includes third bond pads;
second wire bonds electrically coupling the third bond pads of the third semiconductor die to the redistribution structure;
a fourth semiconductor die having a lower surface facing the redistribution structure and an upper surface facing away from the redistribution structure, wherein the lower surface of the fourth semiconductor die is coupled to the upper surface of the third semiconductor die, wherein the fourth semiconductor die extends laterally in the direction beyond at least one side of the third semiconductor die to define an overhang portion of the fourth semiconductor die, and wherein the lower surface of the fourth semiconductor die includes fourth bond pads at the overhang portion of the fourth semiconductor die; and
second conductive columns electrically coupling the fourth bond pads of the fourth semiconductor die to the redistribution structure.

18. The semiconductor device of claim 17 wherein the overhang portions of the second and fourth semiconductor dies have the same shape and dimensions.

19. The semiconductor device of claim 17 wherein the upper surface of the second semiconductor die and the lower surface of the third semiconductor die have the same shape and dimensions such that all of the lower surface of the third semiconductor die is directly adjacent to the upper surface of the second semiconductor die.

* * * * *